United States Patent [19]
Parra et al.

[11] Patent Number: 6,167,417
[45] Date of Patent: Dec. 26, 2000

[54] CONVOLUTIVE BLIND SOURCE SEPARATION USING A MULTIPLE DECORRELATION METHOD

[75] Inventors: Lucas Parra, New York, N.Y.; Clay Douglas Spence, Princeton Junction, N.J.

[73] Assignee: Sarnoff Corporation, Princeton, N.J.

[21] Appl. No.: 09/191,217

[22] Filed: Nov. 12, 1998

Related U.S. Application Data

[60] Provisional application No. 60/081,101, Apr. 8, 1998.

[51] Int. Cl.$^7$ .......................... G06F 15/00; G06F 17/10
[52] U.S. Cl. ........................................ 708/405; 708/319
[58] Field of Search ..................... 708/405, 315, 708/319, 422; 702/191

[56] References Cited

U.S. PATENT DOCUMENTS

| | | | |
|---|---|---|---|
| 5,208,786 | 5/1993 | Weinstein et al. | 367/124 |
| 5,539,832 | 7/1996 | Weinstein et al. | 381/94 |
| 5,675,659 | 10/1997 | Torkkola | 381/94.1 |
| 5,724,485 | 3/1998 | Rainton | 381/71.1 |
| 5,825,671 | 10/1998 | Deville | 702/191 |
| 5,909,646 | 6/1999 | Deville | 455/313 |

OTHER PUBLICATIONS

S. Amari, S.C. Douglas, A. Cichocki, H.H. Yang, "Novel on–Line Adaptive Learning Algorithms for Blind Deconvolution Using the Natural Gradient Approach", Unknown publication and publication date.

R.H. Lambert, A.J. Bell, "Blind Seperation of Multiple Speakers in a Multipath Environment", Copyright 1997 IIEEE, pp. 423–426.

F. Ehlers, H.G. Schuster, "Blind Separation of Convolutive Mixtures and an Application in Automatic Speech Recognition in a Noisy Environment", IEEE Transactions on Signal Processing, vol. 45, No. 10, Oct. 10, 1997.

S.V. Gerven, D.V. Compernolle, "Signal Separation by Symmetric Adaptive Decorrelation: Stability, Convergence, and Uniqueness", IEEE Transactions on Signal Processing, vol. 43, No. 7, Jul. 1995.

U. Lindgren, T. Wigren, H. Broman, "On Local Convergence of a Class of Blind Separation Algorithms", IEEE Transactions on Signal Processing, Vo. 43, No. 12, Dec. 1995, pp. 3054–3058.

C. Simon, G. d'Urso, C. Vignat, Ph. Loubaton, C. Jutten, "On the Convolutive Mixture Source Separation by the Decorrelation Approach", KASSP, 1998.

(List continued on next page.)

*Primary Examiner*—Tan V. Mai
*Attorney, Agent, or Firm*—William J. Burke

[57] ABSTRACT

A method and apparatus that performs blind source separation using convolutive signal decorrelation. More specifically, the method accumulates a length of input signal (mixed signal) that includes a plurality of independent signals from independent signal sources. The invention then divides the length of input signal into a plurality of T-length periods (windows) and performs a discrete Fourier transform (DFT) on the signal within each T-length period. Thereafter, estimated cross-correlation values are computed using a plurality of the averaged DFT values. A total number of K cross-correlation values are computed, where each of the K values is averaged over N of the T-length periods. Using the cross-correlation values, a gradient descent process computes the coefficients of a finite impulse response (FIR) filter that will effectively separate the source signals within the input signal. To achieve an accurate solution, the gradient descent process is constrained in that the time-domain values of the filter coefficients can attain only certain values, i.e., the time-domain filter coefficient values $W(\tau)$ are constrained within each T-length period to be zero for any time $t>Q$. In this manner, a unique solution for the FIR filter coefficients is computed and a filter produced using these coefficients will effectively separate the source signals.

16 Claims, 2 Drawing Sheets

OTHER PUBLICATIONS

H. Sahlin, H. Broman, "Separation of real–world signals", Signal Processing 64 (1998) 103–113.

E. Weinstein, M. Feder, A.V. Oppenheim, "Multi–Channel Signal Separation by Decorrelation", IEEE Transactions on Speech and Audio Processing, vol. 1, No. 4, Oct. 1993.

Te–Won Lee, A.J. Bell, R.H. Lambert, "Blind Separation of Delayed and Convolved Sources", Advances in Neural Information Processing Systems, 1996, 1997.

Hoang–Lan Nguyen Thi, C. Jutten, "Blind Source Separation for Convolutive Mixtures", Signal Processing 45 (1995) 209–229.

S.C. Douglas, A. Cichocki, S. Amari, "Quasi–Newton Filtered–Error and Filtered–Regressor Algorithms for Adaptive Equalization and Deconvolution", IEEE Workshop Signal Proc. Adv. Wireless Comm., Paris, France, Apr. 1997.

S. Amari, S.C. Douglas, A. Cichocki, H.H. Yang, "Multichannel Blind Deconvolution and Equalization Using the Natural Gradient", Proc. 1st IEEE Workshop on Signal Processing Appl Wireless Comm., Paris, France 1997.

S.C. Douglas, A. Cichocki, S. Amari, "Self–Whitening Algorithms for Adaptive Equalization and Deconvolution", IEEE Transactions on Signals Processing, EDICS Category No. SP 1.6.5.

CONVOLUTIVE BLIND SOURCE SEPARATION USING A MULTIPLE DECORRELATION METHOD

This application claims the benefit of U.S. Provisional Application Ser. No. 60/081,101 filed Apr. 8, 1998, which is herein incorporated by reference.

The invention relates to signal processing and, more particularly, the invention relates to a method and apparatus for performing signal separation using a multiple decorrelation technique.

BACKGROUND OF THE INVENTION

A growing number of researchers have recently published techniques that perform blind source separation (BSS), i.e., separating a composite signal into its constituent component signals without a priori knowledge of those signals. These techniques find use in various applications such as speech detection using multiple microphones, crosstalk removal in multichannel communications, multipath channel identification and equalization, direction of arrival (DOA) estimation in sensor arrays, improvement of beam forming microphones for audio and passive sonar, and discovery of independent source signals in various biological signals, such as EEG, MEG and the like. Many of the BSS techniques require (or assume) a statistical dependence between the component signals to accurately separate the signals. Additional theoretical progress in signal modeling has generated new techniques that address the problem of identifying statistically independent signals—a problem that lies at the heart of source separation.

The basic source separation problem is simply described by assuming $d_s$ statistically independent sources $s(t)=[s_1(t), \ldots, s_{d_s}(t)]^T$ that have been convolved and mixed in a linear medium leading to $d_x$ sensor signals $x(t)=[x_1(t), \ldots, x_{d_s}(t)]^T$ that may include additional sensor noise $n(t)$. The convolved, noisy signal is represented in the time domain by the following equation (known as a forward model):

$$x(t) = \sum_{\tau=0}^{P} A(\tau)s(t-\tau) + n(t) \quad (1)$$

Source separation techniques are used to identify the $d_x d_s P$ coefficients of the channels A and to ultimately determine an estimate $s(t)$ for the unknown source signals.

Alternatively, the convolved signal may be filtered using a finite impulse response (FIR) inverse model represented by the following equation (known as the backward model):

$$u(t) = \sum_{\tau=0}^{Q} W(\tau)x(t-\tau) \quad (2)$$

In this representation, a BSS technique must estimate the FIR inverse components W such that the model source signals $u(t)=[u_1(t), \ldots, u_{d_u}(t)]^T$ are statistically independent.

An approach to performing source separation under the statistical independence condition has been discussed in Weinstein et al., "MultiChannel Signal Separation by Decorrelation", *IEEE Transaction on Speech and Audio Processing*, vol. 1, no. 4, pp. 405–413, 1993, where, for non-stationary signals, a set of second order conditions are specified that uniquely determine the parameters A in the forward model. However, no specific algorithm for performing source separation based on non-stationarity is given in the Weinstein et al. paper.

Early work in the signal processing community had suggested decorrelating the measured signals, i.e., diagonalizing measured correlations for multiple time delays. For an instantaneous mix, also referred to as the constant gain case, it has been shown that for non-white signal decorrelation using multiple filter taps is sufficient to recover the source signals. However, for convolutive mixtures of wide-band signals, this technique does not produce a unique solution and, in fact, may generate source estimates that are decorrelated but not statistically independent. As clearly identified by Weinstein et al. in the paper cited above, additional conditions are required to achieve a unique solution of statistically independent sources. In order to find statistically independent source signals, it is necessary to capture more than second order statistics, since statistical independence requires that not only second but all higher cross moments vanish.

In the convolutive case, Yellin and Weinstein in "Multi-channel Signal Separation: Methods and Analysis", *IEEE Transaction on Signal Processing;* vol. 44, no. 1, pp. 106–118, January 1996 established conditions on higher order multi-tap cross moments that allow convolutive cross talk removal. Although the optimization criteria extends naturally to higher dimensions, previous research has concentrated on a two dimensional case because a multi-channel FIR model (see equation 2) can be inverted with a properly chosen architecture using estimated forward filters. Heretofore, for higher dimensions, finding a stable approximation of the forward model has been illusive.

These prior art techniques generally operate satisfactorily in computer simulations but perform poorly for real signals, e.g., audio signals. One could speculate that the signal densities of the real signals may not have the hypothesized structures, the higher order statistics may lead to estimation instabilities, or a violation of the signal stationarity condition may cause inaccurate solutions.

Therefore, there is a need in the art for a blind source separation technique that accurately performs convolutive signal decorrelation.

SUMMARY OF THE INVENTION

The disadvantages of the prior art are overcome by a method and apparatus that performs blind source separation using convolutive signal decorrelation by simultaneously diagonalizing second order statistics at multiple time periods. More specifically, the invention accumulates a length (segment) of input signal that comprises a mixture of independent signal sources. The invention then divides the length of input signal into a plurality of T-length periods (windows) and performs a discrete Fourier transform (DFT) on the mixed signal over each T-length period. Thereafter, the invention computes K cross-correlation power spectra that are each averaged over N of the T-length periods. Using the cross-correlation power values, a gradient descent process computes the coefficients of a FIR filter that will effectively separate the source signals within the input signal by simultaneously decorrelating the K cross-correlation power spectra. To achieve an accurate solution, the gradient descent process is constrained in that the time-domain values of the filter coefficients can attain only certain values, i.e., the time-domain filter coefficient values $W(\tau)$ are constrained within the T-length period to be zero for any time $\tau > Q << T$. In this manner, the so-called "permutation problem" is solved and a unique solution for the FIR filter coefficients is computed such that a filter produced using these coefficients will effectively separate the source signals.

Generally, the invention is implemented as a software routine that is stored in a storage medium and executed on a general purpose computer system. However, a hardware implementation is readily apparent from the following detailed description.

The present invention finds application in a voice recognition system as a signal preprocessor system for decorrelating signals from different sources such that a voice recognition processor can utilize the various voice signals that are separated by the invention. In response to the voice signals, the voice recognition processor can then produce computer commands or computer text.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention estimates values of parameters W for the backward model of equation 2 by assuming non-stationary source signals and using a least squares (LS) optimization to estimate W as well as signal and noise powers. The invention transforms the source separation problem into the frequency domain and solves simultaneously a source separation problem for every frequency.

Figure 1:
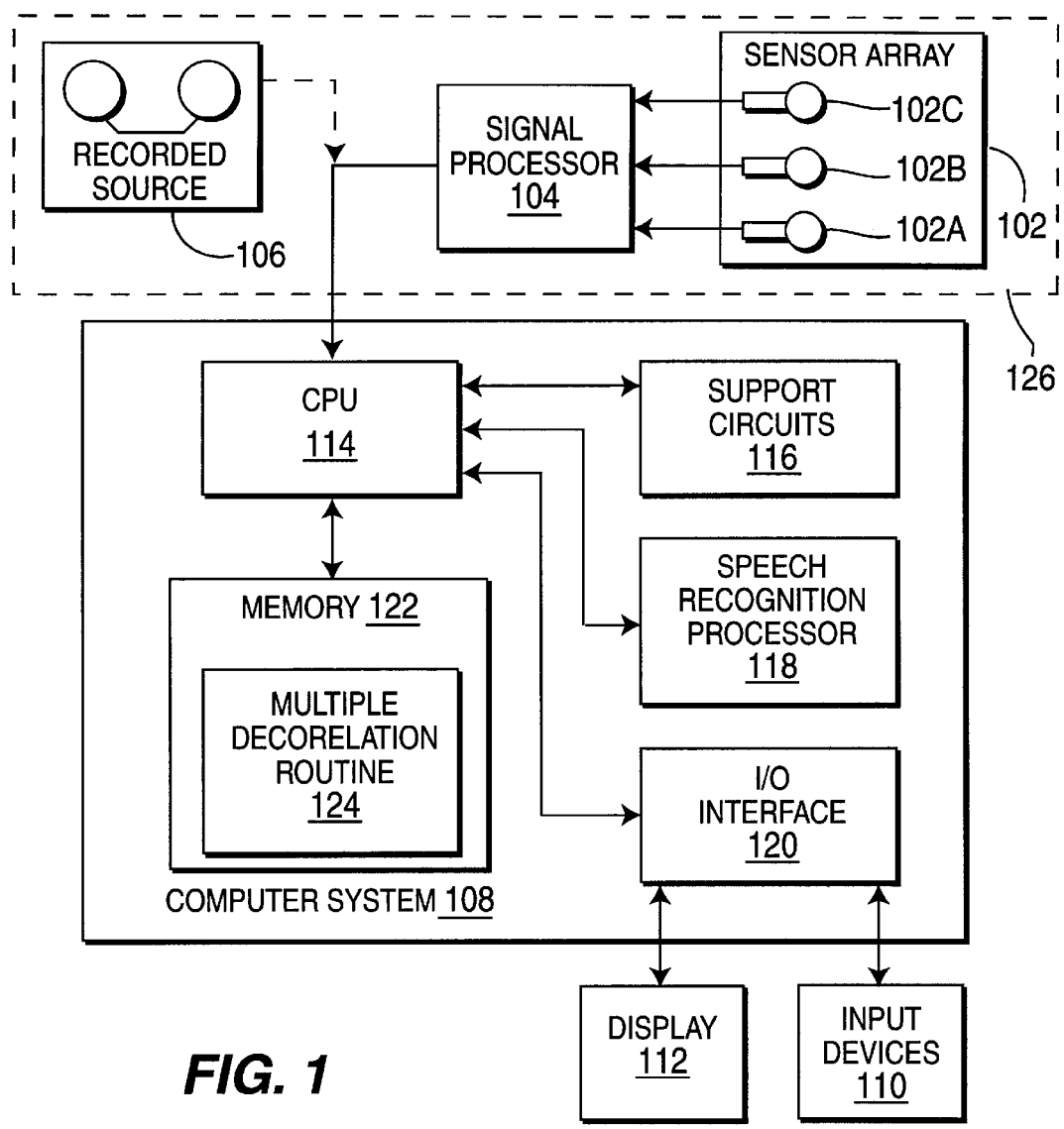
FIG. 1 depicts a system for executing a software implementation of the present invention.

FIG. 1 depicts a system 100 for implementing the source separation method of the present invention. The system 100 comprises a convolved signal source 126 that supplies the signal that is to be separated into its component signals and a computer system 108 that executes the multiple decorrelation routine 124 of the present invention. The source 126 may contain any source of convolved signals, but is illustratively shown to contain a sensor array 102, a signal processor 104 and a recorded signal source 106. The sensor array contains one or more transducers 102A, 102B, 102C such as microphones. The transducers are coupled to a signal processor 104 that performs signal digitization. A digital signal is coupled to the computer system 108 for signal separation and further processing. A recorded signal source 106 may optionally form a source of the convolutive signals that require separation.

The computer system 108 comprises a central processing unit (CPU) 114, a memory 122, support circuits 116, and an input/output (I/O) interface 120. The computer system 108 is generally coupled through the I/O interface 120 to a display 112 and various input devices 110 such as a mouse and keyboard. The support circuits generally contain well-known circuits such as cache, power supplies, clock circuits, a communications bus, and the like. The memory 122 may include random access memory (RAM), read only memory (ROM), disk drive, tape drive, and the like, or some combination of memory devices. The invention is implemented as the multiple decorrelation routine 124 that is stored in memory 122 and executed by the CPU 114 to process the signal from the signal source 126. As such, the computer system 108 is a general purpose computer system that becomes a specific purpose computer system when executing the routine 124 of the present invention. Although a general purpose computer system is illustratively shown as a platform for implementing the invention, those skilled in the art will realize that the invention can also be implemented in hardware as an application specific integrated circuit (ASIC), a digital signal processing (DSP) integrated circuit, or other hardware device or devices. As such, the invention may be implemented in software, hardware, or a combination of software and hardware.

The illustrative computer system 108 further contains speech recognition processor 118, e.g., a speech recognition circuit card or a speech recognition software, that is used to process the component signals that the invention extracts from the convolutive signal. As such, a conference room having a plurality of people speaking and background noise can be monitored with multiple microphones 102. The microphones 102 produce a composite speech signal that requires separation into component signals if a speech recognition system is to be used to convert each person's speech into computer text or into computer commands. The composite speech signal is filtered, amplified and digitized by the signal processor 104 and coupled to the computer system 108. The CPU 114, executing the multiple decorrelation routine 124, separates the composite signal into its constituent signal components. From these constituent components, background noise can easily be removed. The constituent components without noise are then coupled to the speech recognition processor 118 to process the component signals into computer text or computer commands. In this manner, the computer system 108 while executing the multiple decorrelation routine 124 is performing signal preprocessing or conditioning for the speech recognition processor 118.

Figure 2:
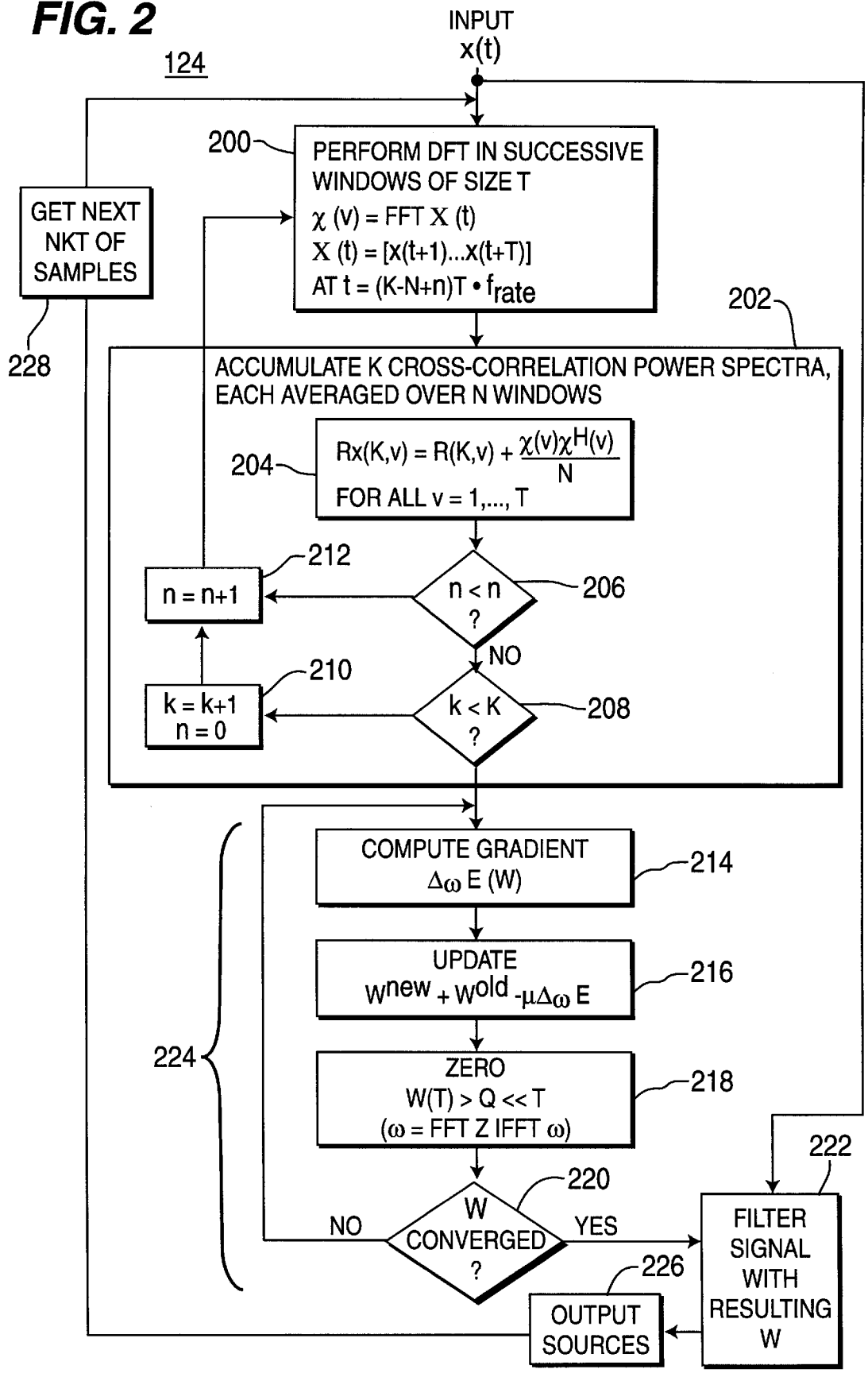
FIG. 2 is a flow diagram of a method of the present invention.

FIG. 2 depicts a flow diagram of the multiple decorrelation routine 124 of the present invention. At step 200, the convolutive (mixed) signal is input, the signal is parsed into a plurality of windows containing T-samples of the input signal X(t), and the routine produces a discrete Fourier transform (DFT) values for each window $\chi$(t), i.e., one DFT value for each window of length T samples.

At step 202, the routine 124 uses the DFT values to accumulate K cross-correlation power spectra, where each of the K spectra are averaged over N windows of length T samples.

For non-stationary signals, the cross correlation estimates will be dependent on the absolute time and will indeed vary from one estimation segment (an NT period) to the next. The cross correlation estimates computed in step 204 are represented as:

$$\hat{R}_x(t, v) = \frac{1}{N} \sum_{n=0}^{N-1} \chi(t+nT, v) \chi^T(t+nT, v) \qquad (5)$$

where:

$\chi$(t+nT, v)=FFT X(t+nT)

X(t)=[x(t)–x(t+T–1)]

and $\chi$(v) is the FFT of the input signal within a window containing T samples. As such, the routine, at step 204, computes a matrix for each time t and for each frequency v and then sums all the matrix components with each other matrix component. Steps 206, 208, 210 and 212 iterate the correlation estimation of step 204 over n=0 to N and k=0 to K to produce the K spectra.

Equation 5 can then be simplified to a matrix representation:

$$\hat{R}_x(t,v) = A(v)\Lambda_s(t,v)A^H(v) + \Lambda_n(t,v) \quad (6)$$

If N is sufficiently large, $\Lambda_s(t,\upsilon)$ and $\Lambda_n(t,\upsilon)$ can be modeled as diagonal matrices due to the signal independence assumption. For Equation 6 to be linearly independent for different times, it will be necessary that $\Lambda(t,\upsilon)$ changes over time, i.e., the signals are non-stationary.

Using the cross correlation estimates of equation 6, the invention computes the source signals using cross-power-spectra satisfying the following equation:

$$\Lambda_s(t,v) = W(v)(\hat{R}_x(t,v) - \Lambda_n(t,v))W^H(v) \quad (7)$$

In order to obtain independent conditions for every time period, the time periods are generally chosen to have non-overlapping estimation times for $\hat{R}_x(t_k,\upsilon)$, i.e., $t_k$=kTN. But if the signals vary sufficiently fast, overlapping estimation times may be utilized. Furthermore, although the windows T are generally sequential, the windows may overlap one another such that each DFT value is derived from signal information that is also contained in the previous window. In an audio signal processing system, the specific value of T is selected based upon room acoustics of the room in which the signals are recorded. For example, a large room with many reverberation paths requires a long window T such that the invention can process a substantial amount of signal information to achieve source signal separation. The value of N is generally determined by the amount of available data for processing. Typical values are N=20, T=1024 samples and K=5.

The inventive method computes a multipath channel W (i.e., the tap values of a multidimensional FIR filter) that simultaneously satisfies equation 7 for K estimation periods, e.g., 2 to 5 estimation periods for processing audio signals. Such a process is performed at steps 214, 216, 218 (collectively a filter parameter estimation process 224) and is represented using a least squares estimation procedure as follows:

$$\hat{W}, \hat{\Lambda}_s, \hat{\Lambda}_n = \underset{\substack{W,\Lambda_s,\Lambda_n \\ W(\tau)=0, \tau>Q \\ W_{ii}(v)=1}}{\arg\min} \sum_{v=1}^{T} \sum_{k=1}^{K} \|E(k,v)\|^2 \quad (8)$$

where $$E(k,v) = W(v)(\hat{R}_x(k,v) - \Lambda_n(k,v))W^H(v) - \Lambda_s(k,v) \quad (9)$$

For simplicity, a short form nomenclature has been used in equation 8, where $\Lambda_s(k,v) = \Lambda_s(t_k,v)$ and $\Lambda_s = \Lambda_s(t_1,v), \ldots, \Lambda_s(t_K,v)$ and the same simplified notation also applies to $\Lambda_n(t,\upsilon)$ and $R_x(t,\upsilon)$.

To produce the parameters W, a gradient descent process 224 (containing steps 214, 216, 218, and 220) is used that iterates the values of W as cost function (8) is minimized. In step 216, the W values are updated as $W^{new} = W^{old} - \mu \nabla_w E$, where $\nabla_w E$ is the gradient step value and $\mu$ is a weighting constant that controls the size of the update.

More specifically, the gradient descent process determines the gradient values as follows.

$$\frac{\partial E}{\partial W^*(v)} = \sum_{k=1}^{K} E(k,v)W(v)B^H(k,v) \quad (10)$$

$$\frac{\partial E}{\partial \hat{\Lambda}_s^*(k)} = -diag(E(k,v)) \quad (11)$$

$$\frac{\partial E}{\partial \hat{\Lambda}_n^*(k)} = -diag(W^H(v)E(k,v)W(v)) \quad (12)$$

$$B(k,v) \equiv \hat{R}_x(k,v) - \Lambda_n(k,v) \quad (13)$$

With equation 11 equal to zero, the routine can solve explicitly for parameters $\Lambda_s(k,\upsilon)$, while parameters $\Lambda_n(k,\upsilon)$ and $W(\upsilon)$ are computed with a gradient descent rule, e.g., new values of $\Lambda_s(k,\upsilon)$ and $W(\upsilon)$ are computed with each pass through the routine until the new values of $W(\upsilon)$ are not very different from the old values of $W(\upsilon)$, i.e., W is converged.

Note that equation 8 contains an additional constraint on the filter size in the time domain. Up to that constraint it would seem the various frequencies $\upsilon$=1, ..., T represent independent problems. The solutions $W(\upsilon)$ however are restricted to those filters that have no time response beyond $\tau$>Q<<T. Effectively, the routine parameterizes $Td_sd_x$ filter coefficients in $W(\upsilon)$ with $Qd_sd_x$ parameters $W(\tau)$. In practice, the values of W are produced in the frequency domain, at step 214, e.g., $W(\upsilon)$, then, at step 218, an FFT is performed on these frequency domain values to convert the values of $W(\upsilon)$ to the time domain, e.g., $W(\tau)$. In the time domain, any W value that appears at a time greater than a time Q is set to zero and all values in the range below Q are not adjusted. The adjusted time domain values of are then converted using an inverse FFT back to the frequency domain. By zeroing the filter response in the time domain for all time greater than Q, the frequency response of the filter is smoothed such that a unique solution at each frequency is readily determined.

Figure 3:
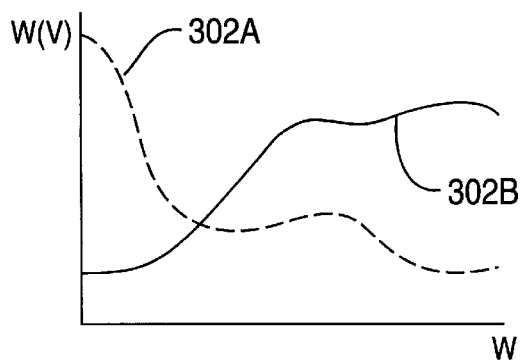
FIG. 3 depicts a frequency domain graph of the filter coefficients generated by the present invention.
Figure 4:
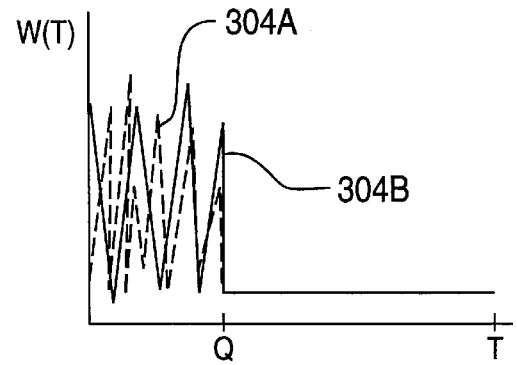
FIG. 4 depicts a time domain graph of the filter coefficients generated by the present invention.

FIG. 3 depicts an illustration of two frequency responses 302A and 302B and FIG. 4 depicts an illustration of their corresponding time-domain responses 304A and 304B. The least squares solutions for the coefficients are found using a gradient descent process performed at step 224 such that an iterative approach is used to determine the correct values of W. Once the gradient in equation 10 becomes "flat" as identified in step 220, the routine, at step 222, applies the computed filter coefficients to an FIR filter. The FIR filter is used to filter the samples of the input (mixed) signal x(t) in the time period KNT in length. The FIR filter generates, at step 226, the decorrelated component signals of the mixed signal. Then, the routine at step 228 gets the next KNT number of samples for processing and proceeds to step 200 to filter the next KNT samples. The previous KNT samples are removed from memory.

As mentioned above, the gradient equations are constrained to remain in the subspace of permissible solutions with $W(\tau)$=0 for $\tau$>Q<<T. This is important since it is a necessary condition for equation 8 to achieve a good approximation.

In practical applications, such as voice recognition signal preprocessing, the inventive routine substantially enhances the performance of the voice recognition accuracy, i.e., word error rates improve by 5 to 50% and in some instances approach the error rate that is achieved when no noise is present. Error rate improvement has been shown when a desired voice signal is combined with either music or another voice signal as background noise.

Although various embodiments which incorporate the teachings of the present invention have been shown and described in detail herein, those skilled in the art can readily devise many other varied embodiments that still incorporate these teachings.

What is claimed is:

1. A method for separating a mixed signal into a plurality of component signals comprising the steps of:
   (a) producing a plurality of discrete Fourier transform (DFT) values, where a DFT value is produced for every T samples of said mixed signal;
   (b) producing a cross correlation estimation matrix that is averaged over N of the DFT values;
   (c) repeating step (b) K times to produce a plurality of cross correlation estimation values;
   (d) computing, using a gradient descent process, a plurality of filter coefficients for a finite impulse response (FIR) filter using the cross correlation estimation values; and
   (e) filtering the mixed signal using the FIR filter having the computed filter coefficients to separate the mixed signal into the plurality of component signals.

2. The method of claim 1 wherein step (d) further comprising the steps of:
   (d1) transforming the filter coefficients from the frequency domain into the time domain;
   (d2) zeroing any filter coefficients having a value other than zero for any time that is greater than a predefined time Q to produce adjusted time domain filter coefficients, where Q is less than T; and
   (d3) transforming the adjusted time domain filter coefficients from the time domain into the frequency domain to produce the filter coefficients used in the gradient descent process.

3. The method of claim 1 wherein the cross correlation estimation values are produced in step (b) using the following equation:

$$\hat{R}_x(t, v) = \frac{1}{N} \sum_{n=0}^{N-1} \chi(t+nT, v) \chi^T(t+nT, v)$$

where $\chi(t,\upsilon)$ is the mixed signal in the frequency domain.

4. The method of claim 3 wherein the gradient descent process minimizes the function:

$$\sum_{v=1}^{T} \sum_{k=1}^{K} \|E(k, v)\|^2$$

where $E(k,\upsilon)$ is an error function.

5. Apparatus for separating a mixed signal into a plurality of component signals comprising:
   means for producing a plurality of discrete Fourier transform (DFT) values, where a DFT value is produced for every T samples of said mixed signal;
   means for producing a plurality of cross correlation estimation values using the DFT values;
   a gradient descent processor for computing a plurality of filter coefficients for a finite impulse response (FIR) filter using the cross correlation estimation values; and
   a filter for filtering the mixed signal using the FIR filter having the computed filter coefficients to separate the mixed signal into the plurality of component signals.

6. The apparatus of claim 5 wherein the gradient descent processor further comprises:
   a first transformer for transforming the filter coefficients from the frequency domain into the time domain;
   means for zeroing any filter coefficients having a value other than zero for any time that is greater than a predefined time Q to produce adjusted time domain filter coefficients, where Q is less than T; and
   a second transformer for transforming the adjusted time domain filter coefficients from the time domain into the frequency domain to produce the filter coefficients used in the gradient descent process.

7. The apparatus of claim 5 wherein the first transformer uses an inverse Fourier transform and the second transformer uses a Fourier transform.

8. The apparatus of claim 5 wherein the cross correlation estimation values are produced using the following equation:

$$\hat{R}_x(t, v) = \frac{1}{N} \sum_{n=0}^{N-1} \chi(t+nT, v) \chi^T(t+nT, v)$$

where $\chi(t,\upsilon)$ is the mixed signal in the frequency domain.

9. The apparatus of claim 5 further comprising a voice recognition system for processing at least one of the plurality of component signals.

10. The apparatus of claim 5 further comprising a plurality of microphones that produce the mixed signal.

11. The apparatus of claim 5 wherein the gradient descent processor minimizes the function:

$$\sum_{v=1}^{T} \sum_{k=1}^{K} \|E(k, v)\|^2$$

where $E(k,\upsilon)$ is an error function.

12. A computer readable storage medium containing a program that, when executed upon a general purpose computer system, causes the general purpose computer system to become a specific purpose computer system that performs a method for separating a mixed signal into a plurality of component signals comprising the steps of:
   (a) producing a plurality of discrete Fourier transform (DFT) values, where a DFT value is produced for every T samples of said mixed signal;
   (b) producing a cross correlation estimation matrix that is averaged over N of the DFT values;
   (c) repeating step (b) K times to produce a plurality of cross correlation estimation values;
   (d) computing, using a gradient descent process, a plurality of filter coefficients for a finite impulse response (FIR) filter using the cross correlation estimation values; and
   (e) filtering the mixed signal using the FIR filter having the computed filter coefficients to separate the mixed signal into the plurality of component signals.

13. The computer readable medium of claim 12 wherein step (d) of the method further comprises the steps of:
   (d1) transforming the filter coefficients from the frequency domain into the time domain;
   (d2) zeroing any filter coefficients having a value other than zero for any time that is greater than a predefined time Q to produce adjusted time domain filter coefficients, where Q is less than T; and (d3) transforming the adjusted time domain filter coefficients from the time domain into the frequency domain to produce the filter coefficients used in the gradient descent process.

14. The computer readable medium of claim 12 wherein the transforming step (d1) uses an inverse Fourier transform and transforming step (d3) uses a Fourier transform.

15. The computer readable medium of claim 12 wherein the cross correlation estimation values are produced in step (b) using the following equation:

$$\hat{R}_x(t, v) = \frac{1}{N} \sum_{n=0}^{N-1} \chi(t+nT, v) \chi^T(t+nT, v)$$

where $\chi(t,v)$ is the mixed signal in the frequency domain.

16. The computer readable medium of claim 12 wherein the gradient descent process minimizes the function:

$$\sum_{v=1}^{T} \sum_{k=1}^{K} \|E(k, v)\|^2$$

where $E(k,v)$ is an error function.

\* \* \* \* \*